United States Patent
Shen et al.

(10) Patent No.: US 7,538,868 B2
(45) Date of Patent: May 26, 2009

(54) PATTERN RECOGNITION MATCHING FOR BRIGHT FIELD IMAGING OF LOW CONTRAST SEMICONDUCTOR DEVICES

(75) Inventors: Wei-Ning Shen, Cupertino, CA (US); Xinkang Tian, San Jose, CA (US); Byeong Su Hwang, San Jose, CA (US); Tuan Van Tran, San Jose, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 381 days.

(21) Appl. No.: 11/311,058

(22) Filed: Dec. 19, 2005

(65) Prior Publication Data

US 2007/0139645 A1 Jun. 21, 2007

(51) Int. Cl.
*G01J 1/10* (2006.01)
(52) U.S. Cl. .................................................. 356/243.1
(58) Field of Classification Search ................. 356/229, 356/237.4, 237.5
See application file for complete search history.

(56) References Cited

U.S. PATENT DOCUMENTS

| | | | |
|---|---|---|---|
| 4,115,762 A | 9/1978 | Akiyama et al. ............ 382/151 |
| 4,672,678 A | 6/1987 | Koezuka et al. ............. 382/219 |
| 4,757,550 A | 7/1988 | Uga ............................ 382/148 |
| 5,098,191 A * | 3/1992 | Noguchi et al. ............. 356/394 |
| 5,477,057 A * | 12/1995 | Angeley et al. ............. 250/548 |
| 6,084,716 A * | 7/2000 | Sanada et al. ............... 359/629 |
| 6,467,911 B1* | 10/2002 | Ueyama et al. ............... 353/87 |
| 7,271,892 B2* | 9/2007 | Shibata et al. ........... 356/237.5 |
| 7,330,265 B2* | 2/2008 | Kurosawa et al. ........... 356/445 |
| 2002/0030807 A1* | 3/2002 | Maeda et al. ............ 356/237.2 |
| 2006/0192943 A1* | 8/2006 | Roberts et al. .............. 356/124 |

\* cited by examiner

*Primary Examiner*—Tarifur R. Chowdhury
*Assistant Examiner*—Isiaka O Akanbi
(74) *Attorney, Agent, or Firm*—Joshua D. Isenberg; JDI Patent (57) ABSTRACT

Calibration of pattern recognition in bright field imaging systems is disclosed. A target pattern on a substrate on the stage is brought into focus of a bright field system. The image is scanned in a first direction while measuring an edge scattering pattern from a feature of the target pattern. The edge scattering pattern is characterized by first and second peaks. A position of the bright field system's illuminator or beam shaping and relay optics is adjusted perpendicular to an optical path until the first and second peaks are approximately equal in height.

20 Claims, 6 Drawing Sheets

PATTERN RECOGNITION MATCHING FOR BRIGHT FIELD IMAGING OF LOW CONTRAST SEMICONDUCTOR DEVICES

FIELD OF THE INVENTION

This invention generally relates to pattern recognition for bright field imaging systems and methods. More particularly, this invention relates to bright field pattern recognition of low contrast semiconductor devices.

BACKGROUND OF THE INVENTION

In a conventional method for recognizing patterns, the object patterns are compared and collated with template patterns previously registered, and a decision is made that the template pattern having the least degree of mismatching (or most degree of matching) is identified as the object pattern. In semiconductor wafer processing, pattern recognition is used, e.g., for wafer alignment. A pattern recognition method typically involves memorizing the pattern of a specified characteristic area, i.e. the key pattern, on the surface of a semiconductor wafer located at a predetermined position, and the position of the key pattern, and detecting the same pattern as the key pattern at other locations on the surface of the semiconductor wafer.

By way of example, U.S. Pat. No. 4,757,550 describes an automatic alignment system that uses pattern recognition. This system performs primary positioning of an object on the basis of low magnification pattern matching of a part of the image. The system subsequently performs secondary positioning of the object on the basis of high magnification pattern matching of a part of the image.

U.S. Pat. No. 4,672,678 describes a pattern recognition apparatus. The apparatus includes an image input device, an analog-to-digital converter that converts an analog image signal from the input device to a binary signal. A frame memory stores the binary signal. A pattern recognition circuit compares the binary signal stored in frame memory with a template memory. A template matching circuit compares character and image patterns in the template memory. A featured template forming circuit automatically forms mismatched portions of the character and image patterns as a featured template and registers them in the featured template.

U.S. Pat. No. 4,115,762 describes an alignment pattern detecting apparatus having an image pick-up device that scans and picks up an optical image of alignment pattern formed on a wafer to produce a time-base video signal. The video signal is sampled at predetermined intervals and converting from analog to digital form so that the video signal is returned symmetrically at a predetermined point to determine the degree of matching between the two signals to obtain a point where the degree of matching is the best. This best matching degree point is detected as the center position of the alignment pattern.

The above prior art techniques were capable of performing pattern recognition on high contrast wafers using bright field systems. Unfortunately, when a wafer has a thicker and more opaque film, the pattern recognition images generally show a low pattern contrast. Such, low contrast wafers present a challenge for prior art pattern recognition techniques. Bright field images from low contrast wafers provide very few characters (or features) in binary signals. These image features can appear differently when imaged with different systems. The variations between images taken with two systems are largely a function of system alignment. Prior art methods of pattern recognition are not robust enough to handle trivial deviation of low contrast images between systems. These trivial variations can lead to failure of pattern recognition matching.

Thus, there is a need in the art, for a pattern recognition method and system that overcomes the above disadvantages.

SUMMARY OF THE INVENTION

Embodiments of the present invention directed to calibrating bright field image systems for imaging low contrast substrates overcome the disadvantages associated with the prior art. A bright field pattern recognition system having an objective lens proximate a stage, a beam splitter optically coupled to the objective lens, an illuminator optically coupled to the beam splitter along a first optical path, beam shaping and relay optics optically coupled to the beam splitter and the illuminator, and an imaging detector optically coupled to the beam splitter along a second optical path. A target pattern on a substrate on the stage is brought into focus. The image is scanned in a first direction while measuring an edge scattering pattern from a feature of the target pattern. The edge scattering pattern is characterized by first and second peaks. A position of the illuminator or beam shaping and relay optics is adjusted with respect to a plane perpendicular to the first optical path until the first and second peaks are approximately equal in height.

Such calibration of bright field systems greatly reduces pattern recognition failure and allows for repeatable pattern recognition of the same feature on different bright field systems.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the embodiments of the invention described below are set forth without any loss of generality to, and without imposing limitations upon, the claimed invention.

Figure 1A:
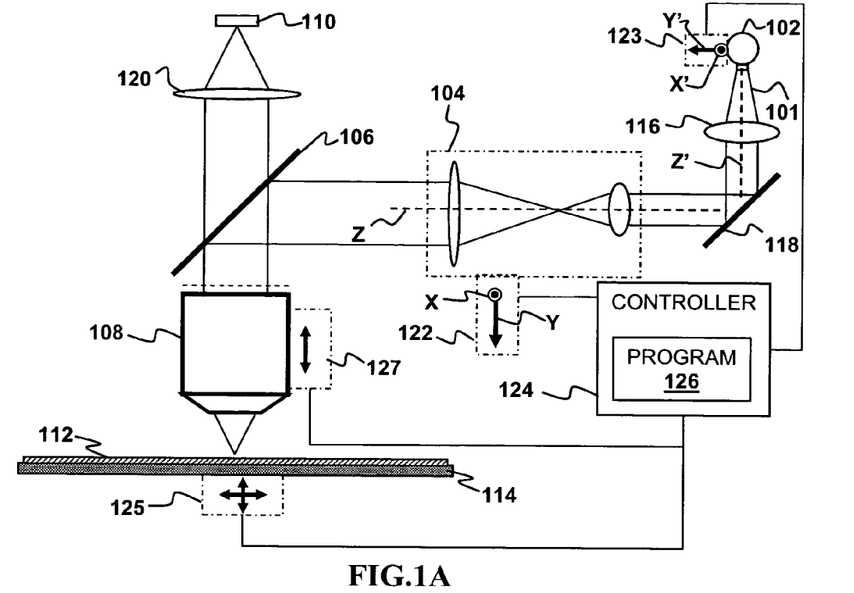
FIGS. 1A-1B are schematic diagrams of bright field imaging systems according to an embodiment of the present invention.
Figure 1B:
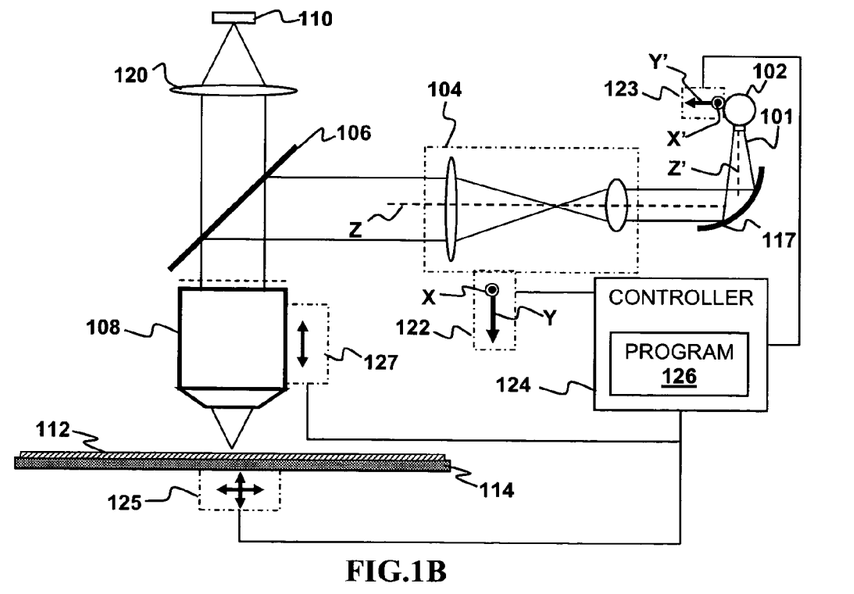

Embodiments of the present invention allow for transportability of pattern recognition recipes between bright field systems for low contrast substrates. FIGS. 1A-1B depict examples of bright field imaging systems according to embodiments of the present invention. In embodiments of the present invention, bright field imaging systems are modified to be calibrated for imaging low contrast substrates with a high rate of success of image pattern matching. In general a bright field imaging system 100 includes a light source 102, beam shaping and relay optics 104, a beam splitter 106, an objective lens 108 and an imaging detector 110. A low contrast substrate 112 rests on a stage 114. A condenser lens 116 collimates light 101 from the source 102 into a parallel beam. The condenser lens 116 and plane reflector 118 may be replaced with a suitable curved reflector 117 (e.g. a parabolic reflector) as illustrated in FIG. 1B. A plane reflector 118 may couple the parallel beam into the beam shaping and relay optics 104. The beam splitter 106 couples at least a portion of the light 101 to the objective lens 108, which focuses the light onto the substrate 112. Light from the objective lens 108 scatters off the surface of the substrate 112 and some of the scattered light passes back through the objective lens 108, which collimates the light into a parallel beam. This parallel beam passes back through the beam splitter 106 and is optically coupled to the imaging detector 110. By way of example, and without limitation, a lens 120 may focus the parallel beam of scattered light onto the imaging detector (e.g., a charge coupled device (CCD) array) which forms a magnified image of a portion of the surface of the substrate 112.

The system 100 includes one or more actuators 122 that adjust a position of the beam shaping and relay optics 104 in one or two directions x, y perpendicular to an optical path between the light source 102 and the beam splitter 106. For example the x- and y-directions may be perpendicular to an optical axis z of the relay and beam shaping optics, which is part of the optical path between the light source 102 and the beam splitter 106. In the examples depicted in FIGS. 1A-1B, the y-direction is indicated by the arrows representing the actuators 122. The x-direction is perpendicular to the plane of the drawing. In a like manner, one or more actuators 123 may adjust a position of the light source 102 along directions x', y' that are perpendicular to an optical path z' between the light source and the beam shaping and relay optics, which is part of the optical path between the light source 102 and the beam splitter 106. In FIGS. 1A-1B the y'- and z'-directions are in the plane of the drawing and the x'-direction is perpendicular to the plane of the drawing. In addition, one or more actuators 125 may adjust a position the stage 114 either parallel or perpendicular to the plane of the substrate 112. Additional actuators 127 may adjust a position of the objective lens 108 to facilitate focusing an image of the surface of the substrate 112. The actuators 122, 123, 125 may operate in response to signals from a controller unit 124. The controller unit may include programmable processor that operates in response to program instructions 126 that control the alignment of the beam shaping and relay optics 104 during calibration as described below. Examples of bright field imaging systems include bright field metrology systems such as a dual-beam reflectometer on a Spectra Fx100 thin film metrology system from KLA-Tencor Corporation of San Jose, Calif. Examples of bright field imaging systems also include bright field inspection systems, such as Model 2360 or Model 2370 high resolution imaging inspection systems, both of which are also available from KLA-Tencor Corporation.

Figure 2A:
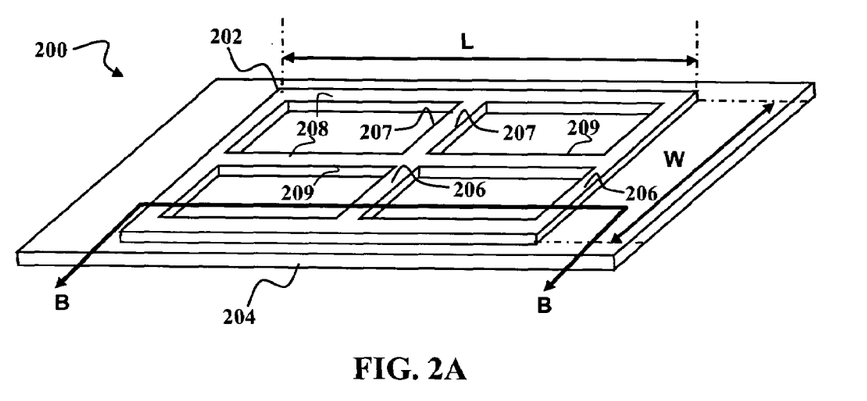
FIG. 2A is a three-dimensional schematic diagram of a feature on a low contrast wafer.
Figure 2B:
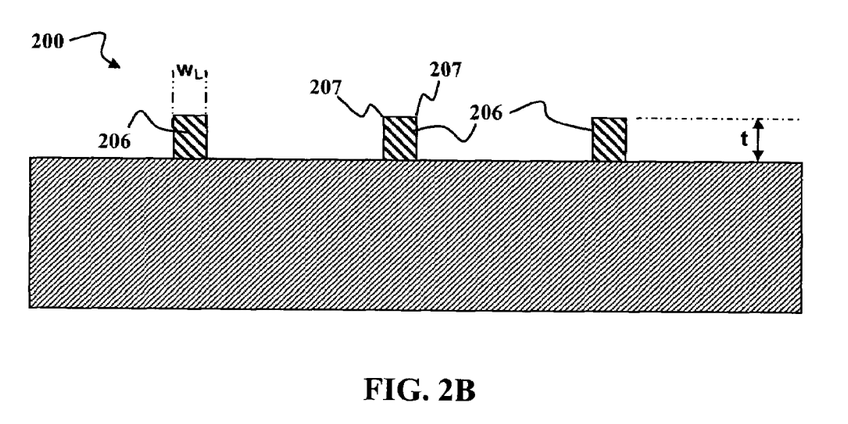
FIG. 2B is a cross-sectional schematic diagram taken along line B-B of FIG. 2A.

According to embodiments of the present invention, most features in images of low contrast substrates result from edge scattering. FIGS. 2A-2B illustrate an example of a portion of a low contrast substrate 200, having a test pattern structure 202 formed on an underlying substrate material 204. The structure 202 includes one or more features in the form of a series of vertical lines 206 and horizontal lines 208 forming a "window" shape. Low contrast results from the use of the same or similar materials or similarly rough materials for the substrate 204 and the lines 206, 208. By way of example, the substrate may be made of silicon and the lines may be made of silicon dioxide. In an alternative example, both the lines 206, 208 and the substrate 204 may be made of tungsten. The structure 202 is characterized by a length L and a width W. The lines 206, 208 are characterized by line widths $w_L$ and thicknesses t as depicted in FIG. 2B.

Figure 3A:
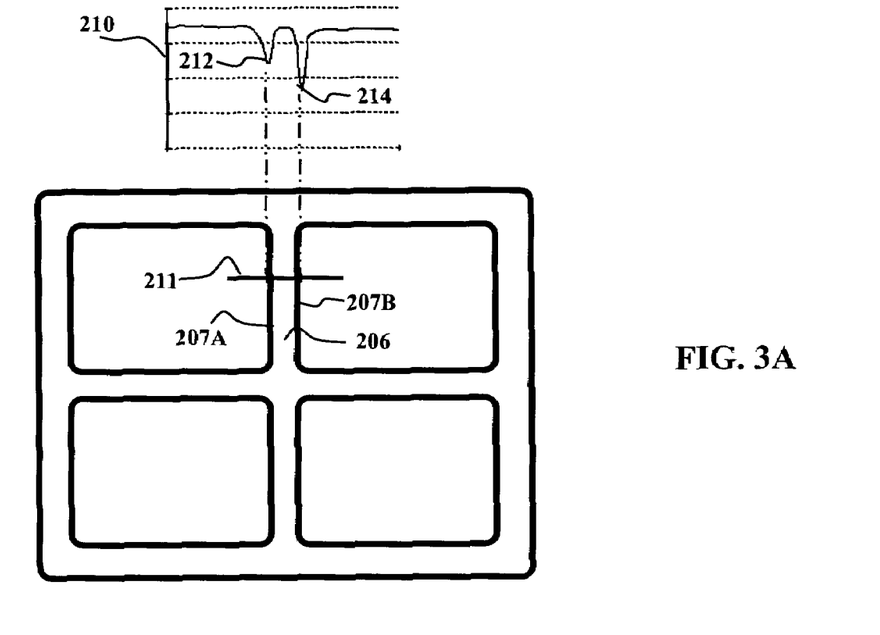
FIGS. 3A-3C are diagrams of bright field images of a low contrast feature of the type shown in FIGS. 2A-2B illustrating calibration of bright field imaging systems according to an embodiment of the present invention.

For the low contrast substrate 200 the light scattering properties of the lines 206, 208 and underlying substrate 204 are sufficiently similar that the contrast in a bright field image of the structure 202 largely results from scattering at edges 207, 209 of the lines 206, 208. Because the resulting images are of low contrast, intensity profiles typically have only a few "peaks" due to edge scattering from features of the topography of the low contrast substrate 200. As illustrated in FIG. 3A, when a scan of the scattered light intensity is taken across a section of the structure 202 the resulting intensity profile 210 is characterized by "peaks" 212, 214. In this case, that scan is taken along the path indicated at 211 that cuts across a vertical line 206 of the structure 202. A first peak 212 results from scattering at a left edge 207A of the vertical line 206. A second peak 214 results from scattering at a right edge 207B of the vertical line 206. Although the values of L, W, $w_L$, and t may be quite small, they are preferably, large enough that a bright field imaging system can image and resolve them. By way of example, a typical bright field imaging system can resolve the features of the structure 202 where L is about 140 microns, W is about 107 microns, and t is about 500 to about 1500 angstroms. The line width $w_L$ is preferably large enough that the bright field imaging system can resolve scattering peaks from each edge of a given line. Line widths on the order of larger than about 1 micron, preferably between about 5 microns and about 30 microns, e.g., are usually sufficient. The line width $w_L$ may be calibrated against a known standard. The linewidth should be larger than 1 micron. The optimal linewidth is between 5 to 30 micron.

Figure 3B:
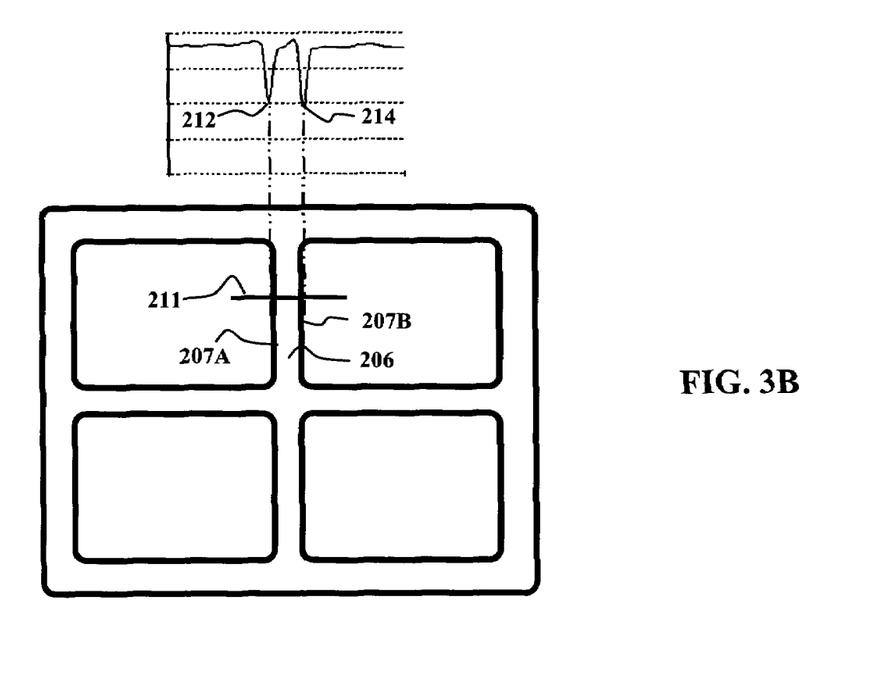
Figure 3C:
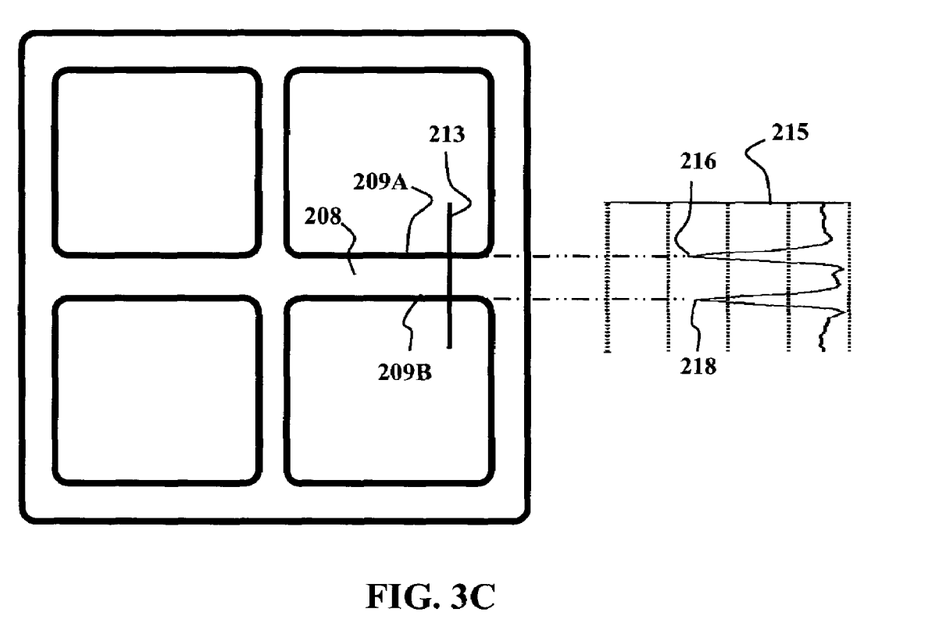

It is noted in this example that the peaks 212, 214 are asymmetrical, i.e., they are of different heights. Even a trivial optical mis-alignment of the bright field imaging system can cause such an asymmetry. The limited number of "peak" features and the asymmetry of the peaks can cause pattern recognition matching to fail between different systems. In other words, patterns that are recognized by one system may not be recognized by another similar system. To overcome this problem, embodiments of the present invention calibrate a bright field imaging system by scanning across a line feature as in FIG. 3A and aligning the system optics until the scattering from the edges is symmetric, i.e., the peaks are of substantially the same height, as shown in FIG. 3B. To further align the system, a similar procedure may be repeated as depicted in FIG. 3C by taking a scan along the path indicated at 213 that cuts across a horizontal line 208 of the structure 202. Scattering from top and bottom edges 209A, 209B results in scattering intensity profile 215 having symmetrical peaks 216, 218. Symmetric scattering may alternatively be defined as a situation where shadows generated by edge scattering are symmetric.

The alignment of the optics to achieve such symmetrical peaks is not trivial. Bright field imaging systems have highly complex optics and many parameters that can be adjusted. Adjustment of all possible parameters can be complicated and time consuming. The inventors have determined, after about seven years of effort, that desired symmetric profiles can be obtained by adjustment of the position of the beam shaping and relay optics 104 with respect to x and y directions perpendicular to optical axis z or by adjustment of the position of the light source 102 with respect to x' and y' directions perpendicular to beam path z'. Although such adjustment may be performed manually, it may also be done automatically, through computer control of the actuators 122 that control the x and y positioning of the beam shaping and relay optics 104 and/or computer control of the actuators 123 that control x', y' positioning light source 102.

Figure 4:
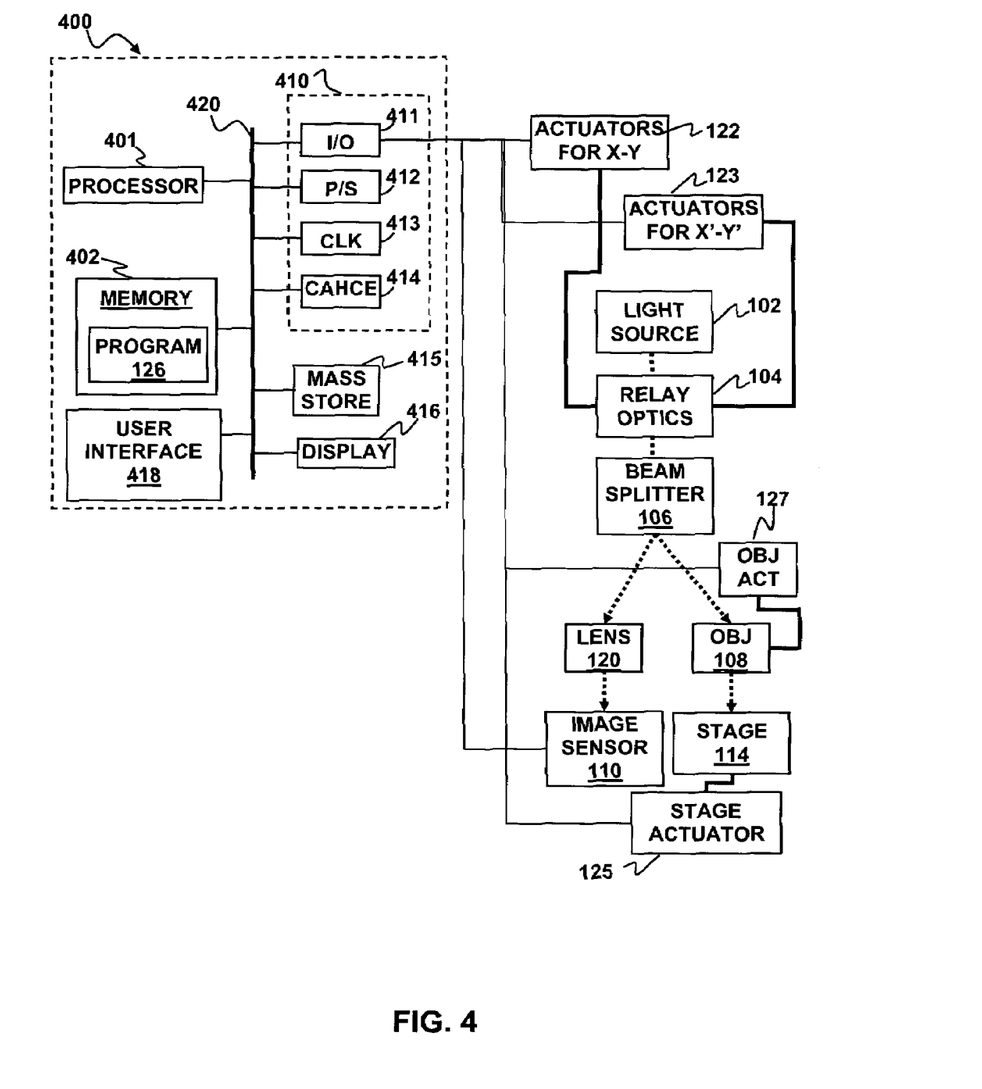
FIG. 4 is a block diagram of a bright field imaging system according to an embodiment of the present invention.

According to additional embodiments of the present invention, the calibration technique described herein may be automated through implementation on a computer operated controller as illustrated in FIG. 4. As depicted in FIG. 4, a bright field imaging system 400 may include all the components depicted in FIGS. 1A-1B, specifically, the light source 102, beam shaping and relay optics 104, beam splitter 106, objective lens 108 imaging detector 110 and controller 124 as described above as well as actuators 122, 123, 125 and 127 for the relay and beam shaping optics, light source, stage and objective.

The controller 124 may include a processor 401 and a memory 402. The processor 401 may be a microprocessor of a type commonly used, e.g., in general purpose computers. The memory 402 may be in the form of an integrated circuit, e.g., RAM, DRAM, ROM, and the like). A computer program 126 may be stored in the memory 402 in the form of processor readable instructions that can be executed on the processor 401. The instructions of the program 126 may include the steps of a calibration method as depicted in FIG. 5 and described below.

The program 126 may conform to any one of a number of different programming languages such as Assembly, C++, JAVA or a number of other languages. The processor 401 forms a general-purpose computer that becomes a specific purpose computer when executing programs such as the program code 126. Although the program 126 is described herein as being implemented in software and executed upon a general purpose computer, those skilled in the art will realize that the method of coordinated tuning of the lasers could alternatively be implemented using hardware such as an application specific integrated circuit (ASIC) or other hardware circuitry. As such, it should be understood that embodiments of the invention can be implemented, in whole or in part, in software, hardware or some combination of both. In one embodiment, among others, the program code 126 may include a set of processor readable instructions that implement a method having features in common with the method 500 described below with respect to FIG. 5.

The controller 124 may also include well-known support functions 410, such as input/output (I/O) elements 411, power supplies (P/S) 412, a clock (CLK) 413 and cache 414. The controller 124 may optionally include a mass storage device 415 such as a disk drive, CD-ROM drive, tape drive, or the like to store programs and/or data. The controller 124 may also optionally include a display unit 416 and user interface unit 418 to facilitate interaction between the controller 124 and a user. The display unit 416 may be in the form of a cathode ray tube (CRT) or flat panel screen that displays text, numerals, graphical symbols or images. The user interface 418 may include a keyboard, mouse, joystick, light pen or other device. These components may be implemented in hardware, software or firmware or some combination of two or more of these.

Figure 5:
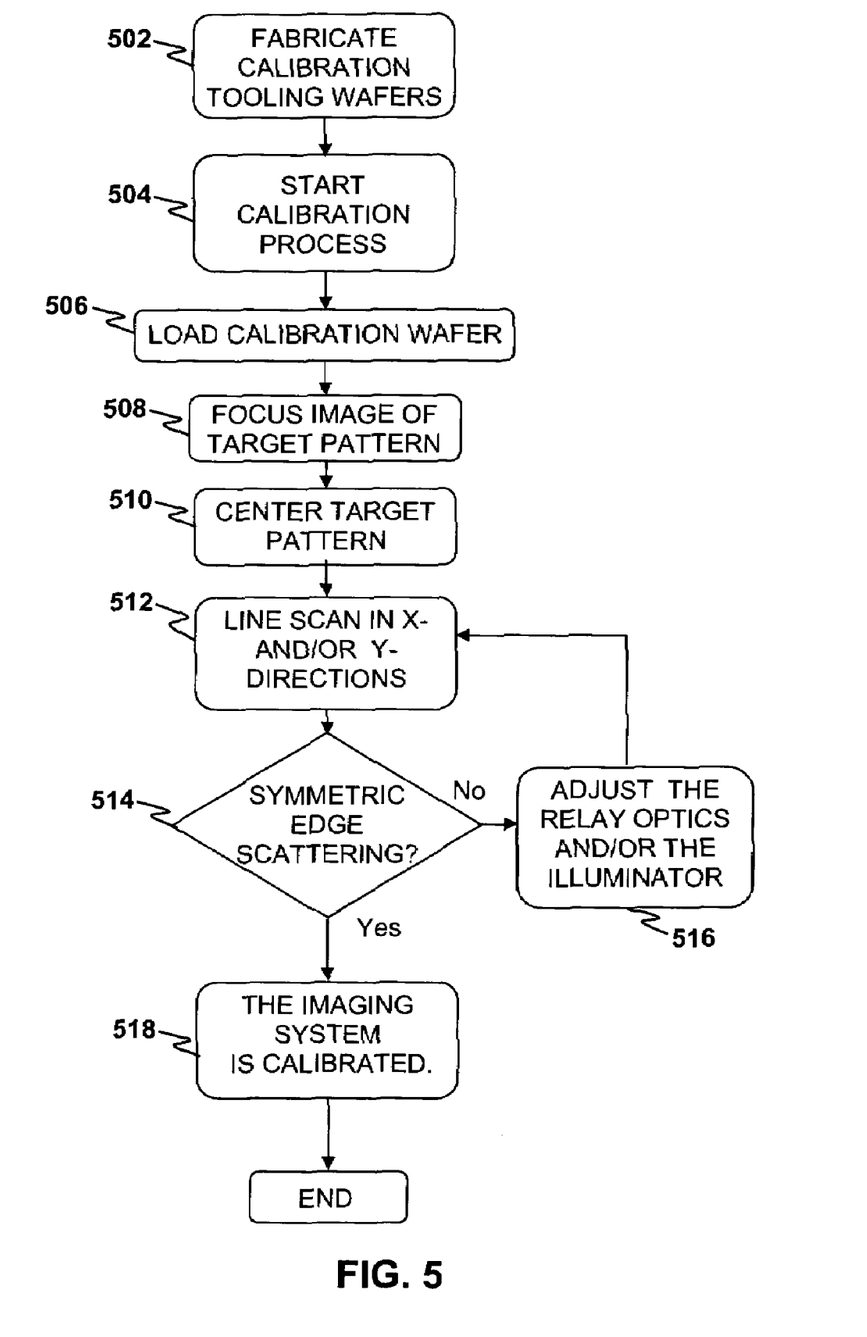
FIG. 5 is a flow diagram illustrating calibration of bright field imaging systems according to an embodiment of the present invention.

Given the foregoing, according to embodiments of the present invention calibration of a bright field system, e.g., as shown in FIGS. 1A-1B and FIG. 4, may be implemented according to a method 500 as set forth in the flow diagram of FIG. 5. The method 500 may optionally start at 502 with fabrication of a low contrast calibration wafer having one or more features of the type depicted in FIGS. 2A-2B and 3A-3C and described above. In general, the calibration wafer includes at least one line feature running that is substantially orthogonal to another line feature. As used herein, substantially orthogonal means orthogonal (i.e., perpendicular) within the ability of the bright field system to determine orthogonality. The materials of the lines and underlying substrate for the calibration wafer are preferably chosen such that image contrast is largely the result of scattering from edges of line features.

Once a calibration wafer has been provided, the calibration process may start at 504. The calibration wafer is loaded onto the stage 114 at 506 and the feature pattern of the calibration wafer is brought into focus at 508 through conventional adjustment of the optics of the bright field system 100. Such adjustment may involve, e.g., adjustment of the relative distance of the objective lens 108 from the surface of the calibration wafer and/or adjustment of the relative distance between the lens 120 and the imaging detector 110. As used herein, adjustment of the relative distance between two objects may involve movement of either object or movement of both of them.

Once the target feature pattern (or a portion thereof) is brought into focus an image of a desired part of the feature pattern may be centered at 510 by moving either the stage or the objective lens parallel to the plane of the wafer using the actuators 125 and/or 127. Scans may be taken across one or more line features of the feature pattern at 512 to produce scattering intensity profiles of the types described above. Real time images of the sample may be displayed on the display device 416 e.g., at a refresh rate of 1 frame per second or greater. A scan profile may be obtained by performing two or more scans of the same feature and determining an average intensity pattern from the two or more scans. Such profiles may be produced e.g., by converting an image of the feature pattern to a digital array, which may be stored in memory 402 and/or mass storage 415. If the memory 402 has sufficient space, multiple line scans (e.g., 10 or more) may be performed on user specified areas of the target substrate and stored. Each element of the array represents the value of the light intensity at a particular pixel in the image. The scan may be obtained digitally by selecting elements of the array that correspond to a line of pixels in that cut across one of the line features of the feature pattern. Separate scans may be performed in two different, substantially orthogonal directions with each scan cutting across a differently oriented line feature of the calibration wafer.

Once a scan has been performed the resulting scan profile can be examined at 514 to determine a background intensity uniformity and identify the intensity profile peaks and whether the profile peaks exhibit symmetric edge scattering, i.e., two scattering peaks of approximately equal height. An average may be taken of several frames of an image and in order to eliminate random noise. Approximately equal height, as used herein, means that the heights are sufficiently close to each other that once the system 100 has been calibrated its pattern recognition failure rate is at or below some acceptable level, preferably less than about 0.01%. If the edge scattering is not symmetric the x, y, position of the beam shaping and relay optics 104 and/or the x', y' position of the light source 102 may be adjusted at 516 as described above until the scattering is symmetric. If the edge scattering is symmetric then the system is properly calibrated at 518 and is substantially free from the lens aberration known as coma.

Once the system 100 has been calibrated, one can determine a pattern recognition threshold for a feature on the calibration wafer. This may be done by testing the calibrated system against a low contrast test wafer having known patterns, determining a success or failure of recognition of each of the known patterns and calculating the percentage with which the system correctly recognizes the known patterns. Such a process may involve several iterations. Such a calibration produces a higher rate of recognition success and facilitates matching of one system to another.

Embodiments of the present invention allow for greater pattern recognition matching between different bright field systems. It is particularly advantageous that embodiments of the invention do not require that two tools be calibrated against the same calibration standard. Sufficient pattern recognition accuracy may be obtained where two tools are calibrated to have symmetric edge scattering from calibrated line features. Calibration wafers having similar features, e.g., similar line width and thickness may be used for this purpose. Although it is preferable to use such calibration wafers, the operator may choose different features on a calibration wafer for calibrating a particular tool. The key is to eliminate the coma in the imaging systems. In principle, wafers other than calibration wafers may also be usable as long as the pattern used in the calibration process has similar geometric and optical characteristics with the calibration wafers.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. In a bright field pattern recognition system having an objective lens proximate a stage, a beam splitter optically coupled to the objective lens, an illuminator optically coupled to the beam splitter along a first optical path, beam shaping and relay optics optically coupled to the beam splitter and the illuminator, and an imaging detector optically coupled to the beam splitter along a second optical path, a method for calibrating the system for imaging low contrast substrates, the method comprising:

bringing a target pattern on a substrate on the stage into focus to form an image at the imaging detector;

scanning the image in a first direction and obtaining from the image a first edge scattering pattern from a first feature of the target pattern, wherein the edge scattering pattern is characterized by first and second peaks; and adjusting a position of the illuminator or beam shaping and relay optics along one or more directions perpendicular to the first optical path until the first and second peaks are approximately equal in height.

2. The method of claim 1 wherein the first feature of the target pattern is oriented substantially orthogonal to the first direction.

3. The method of claim 1, further comprising scanning the image in a second direction and obtaining from the image a second edge scattering pattern from a second feature of the target pattern, wherein the edge scattering pattern is characterized by third and fourth peaks, wherein the second direction is substantially perpendicular to the first direction; and adjusting a position of the illuminator or beam shaping and relay optics along one or more directions perpendicular to the first optical path until the third and fourth peaks are approximately equal in height.

4. The method of claim 3 wherein the second feature of the target pattern is oriented substantially orthogonal to the second direction.

5. The method of claim 1 wherein the feature of the target pattern includes a line characterized by a width that is sufficiently large that the first and second scattering peaks can be resolved.

6. The method of claim 1, wherein the feature of the target pattern is made of the same material as an underlying layer.

7. The method of claim 1 wherein the target pattern is characterized by a thickness of between about 500 angstroms and about 1500 angstroms.

8. The method of claim 1 wherein scanning the image in a first direction and obtaining from the image a first edge scattering pattern includes performing two or more scans of the same feature and determining an average intensity pattern from the two or more scans.

9. The method of claim 1, further comprising, calculating a pattern recognition score for the feature.

10. The method of claim 1, further comprising determining a success or failure of pattern recognition matching for the feature.

11. The method of claim 1 wherein the feature is a calibrated feature characterized by a calibrated line width.

12. The method of claim 11 wherein the calibrated feature is formed on a calibration wafer.

13. The method of claim 1 wherein materials of lines forming the calibrated feature and an underlying substrate of the calibration wafer are chosen such that image contrast in bright field images of the calibrated feature is largely the result of scattering from edges of the lines.

14. The method of claim 1 wherein scanning the image includes converting the image to a digital array wherein each element of the array represents the value of light intensity at a particular pixel in the image; and selecting elements of the array that correspond to a line of pixels in that cut across a line feature of the target pattern.

15. The method of claim 1 wherein measuring the first edge scattering pattern includes determining a background intensity uniformity for the image.

16. A bright field pattern recognition system, comprising:
   a stage;
   an objective lens proximate a stage, a beam splitter optically coupled to the objective lens, an illuminator optically coupled to the beam splitter along a first optical path;
   beam shaping and relay optics optically coupled to the beam splitter and the illuminator; an imaging detector optically coupled to the beam splitter along a second optical path; one or more positioning actuators coupled to the illuminator and/or beam shaping and relay optics; and a controller coupled to the imaging detector, and actuators, the controller being operable in response to processor readable instructions stored in a memory, the processor readable instructions implementing a method for calibrating the system for imaging low contrast substrates, the method comprising:
      bringing a target pattern on a substrate on the stage into focus to form an image at the imaging detector;
      scanning the image in a first direction and obtaining from the image a first edge scattering pattern from a first feature of the target pattern, wherein the edge scattering pattern is characterized by first and second peaks; and using one or more of the positioning actuators to adjust a position of the illuminator or beam shaping and relay optics along one or more directions perpendicular to the first optical path until the first and second peaks are approximately equal in height.

17. The system of claim 16 wherein the processor readable instructions further comprise instructions for scanning the image in a second direction and obtaining from the image a second edge scattering pattern from a second feature of the target pattern, wherein the edge scattering pattern is characterized by third and fourth peaks, wherein the second direction is substantially perpendicular to the first direction; and adjusting a position of the illuminator or beam shaping and relay optics along one or more directions perpendicular to the first optical path until the third and fourth peaks are approximately equal in height.

18. The system of claim 16, further comprising a lens optically coupled to the illuminator and a plane reflector optically coupled between the lens and the beam shaping and relay optics.

19. The system of claim 16, further comprising a curved reflector optically coupled between the illuminator and the beam shaping and relay optics.

20. A processor readable medium having embodied therein a set of processor readable instructions for calibrating a bright field pattern recognition system having an objective lens proximate a stage, a beam splitter optically coupled to the objective lens, an illuminator optically coupled to the beam splitter along a first optical path, beam shaping and relay optics optically coupled to the beam splitter and the illuminator, and an imaging detector optically coupled to the beam splitter along a second optical path, the instructions being adapted to implement a method for calibrating the system for imaging low contrast substrates, the method comprising:

bringing a target pattern on a substrate on the stage into focus to form an image at the imaging detector;

scanning the image in a first direction and obtaining from the image a first edge scattering pattern from a first feature of the target pattern, wherein the edge scattering pattern is characterized by first and second peaks; and adjusting a position of the illuminator or beam shaping and relay optics perpendicular to the first optical path until the first and second peaks are approximately equal in height.

* * * * *